US011489086B2

(12) United States Patent
Inoue et al.

(10) Patent No.: US 11,489,086 B2
(45) Date of Patent: Nov. 1, 2022

(54) METHOD OF MANUFACTURING LIGHT EMITTING ELEMENT

(71) Applicant: NICHIA CORPORATION, Anan (JP)

(72) Inventors: Naoto Inoue, Anan (JP); Minoru Yamamoto, Anan (JP); Satoshi Okumura, Anan (JP); Hiroki Okamoto, Tokushima (JP); Hiroaki Tamemoto, Anan (JP)

(73) Assignee: NICHIA CORPORATION, Anan (JP)

( * ) Notice: Subject to any disclaimer, the term of this patent is extended or adjusted under 35 U.S.C. 154(b) by 121 days.

(21) Appl. No.: 16/908,354

(22) Filed: Jun. 22, 2020

(65) Prior Publication Data
US 2021/0005777 A1 Jan. 7, 2021

(30) Foreign Application Priority Data
Jul. 1, 2019 (JP) .............................. JP2019-123139

(51) Int. Cl.
*H01L 33/00* (2010.01)
(52) U.S. Cl.
CPC ...... *H01L 33/0095* (2013.01); *H01L 33/0093* (2020.05)
(58) Field of Classification Search
None
See application file for complete search history.

(56) References Cited

U.S. PATENT DOCUMENTS

| 5,310,104 A * | 5/1994 | Zaidel .................. B28D 5/0052 225/2 |
| 8,969,752 B2 * | 3/2015 | Fukumitsu ............. B23K 26/40 219/121.16 |
| 2002/0170896 A1 | 11/2002 | Choo et al. |
| 2007/0148803 A1 * | 6/2007 | Yakushiji .......... H01L 21/02576 438/33 |
| 2011/0186554 A1 | 8/2011 | Koyanagi et al. |
| 2011/0195535 A1 | 8/2011 | Koyanagi et al. |
| 2011/0195536 A1 | 8/2011 | Koyanagi et al. |
| 2011/0195537 A1 * | 8/2011 | Koyanagi ............ B28D 5/0011 438/33 |

(Continued)

FOREIGN PATENT DOCUMENTS

| JP | 2002-346782 A | 12/2002 |
| JP | 2006-135309 A | 5/2006 |
| JP | 2011-156582 A | 8/2011 |

(Continued)

*Primary Examiner* — Bradley Smith
(74) *Attorney, Agent, or Firm* — Global IP Counselors, LLP (57) ABSTRACT

A method of manufacturing light emitting elements includes: providing a wafer including a substrate formed of sapphire and having a first main surface and a second main surface, and a semiconductor layered body disposed on the first main surface of the substrate; irradiating a laser beam into the substrate to form a modified region inside the substrate, the modified region having a crack reaching the first main surface and a crack reaching the second main surface; irradiating $CO_2$ laser to a region of the substrate overlapping with a region to which the laser beam has been irradiated; and cleaving the wafer along the modified region to obtain the light emitting elements each having a hexagonal shape in a plan view.

23 Claims, 10 Drawing Sheets (56) References Cited

U.S. PATENT DOCUMENTS

2016/0009586 A1    1/2016   Bookbinder et al.

FOREIGN PATENT DOCUMENTS

| JP | 2011-165766 A | 8/2011 |
|---|---|---|
| JP | 2011-165767 A | 8/2011 |
| JP | 2011-165768 A | 8/2011 |
| JP | 2013-136069 A | 7/2013 |
| JP | 2013-136071 A | 7/2013 |
| JP | 2013-136073 A | 7/2013 |
| JP | 2013-136074 A | 7/2013 |
| JP | 2013-136075 A | 7/2013 |
| JP | 2013-136077 A | 7/2013 |
| JP | 2016-513024 A | 5/2016 |
| WO | 2007119740 A1 | 10/2007 |

* cited by examiner

METHOD OF MANUFACTURING LIGHT EMITTING ELEMENT

CROSS-REFERENCE TO RELATED APPLICATION

This application claims priority to Japanese Patent Applications No. 2019-123139, filed on Jul. 1, 2019, the disclosure of which is hereby incorporated by reference in its entirety.

BACKGROUND

1. Technical Field

The present disclosure relates to a method of manufacturing light emitting elements.

2. Description of Related Art

In manufacturing light emitting elements, a wafer including a sapphire substrate and a semiconductor layered body is cleaved. For example, steps of manufacturing light emitting elements include: irradiating a laser beam into a substrate to form a modified region inside the substrate; and cleaving the wafer along a planned cleavage line which passes through the modified region to separate into individual light emitting elements (For example, see JP 2011-165766 A, JP 2006-135309 A).

SUMMARY

When obtaining the light emitting elements having a hexagonal shape in a top view, in singulating the wafer into light emitting elements, the cleaving may occur with deviation from the planned cleavage line. In this case, defect in shape of a plurality of light emitting elements may occur linearly across the wafer, resulting in a reduction of yield of the light emitting elements.

One embodiment of the present invention has been made in view of the problem as described above, and one object thereof is to manufacture light emitting elements in a high yield, such that cleavage occurs without deviating from the cleavage-plan line in the separation of a wafer into individual light emitting elements having a hexagonal shape in a top view.

According to one embodiment of the present disclosure, a method of manufacturing light emitting elements includes: providing a wafer including a substrate formed of sapphire and having a first main surface and a second main surface, and a semiconductor layered body disposed on the first main surface of the substrate; irradiating a laser beam into the substrate to form a modified region inside the substrate, the modified region having a crack reaching the first main surface and a crack reaching the second main surface; irradiating $CO_2$ laser to a region of the substrate overlapping with a region to which the laser beam has been irradiated; and cleaving the wafer along the modified region to obtain the light emitting elements each having a hexagonal shape in a plan view.

According to certain embodiments of the present invention, when a wafer is separated into light emitting elements having a hexagonal shape in a top view, cleavage can occur without deviating from the planned cleavage line, so that the light emitting elements can be manufactured in a high yield.

DETAILED DESCRIPTION

Embodiments described below are examples for giving a concrete form to the technical idea of the present invention, and not intended to limit the scope of the present invention to the description below. The size and positional relationship of members in the drawings may be exaggerated for the sake of clarity. In general, an identical or similar member is denoted by an identical name or reference numeral, and a description thereof may be appropriately omitted.

Figure 1A:
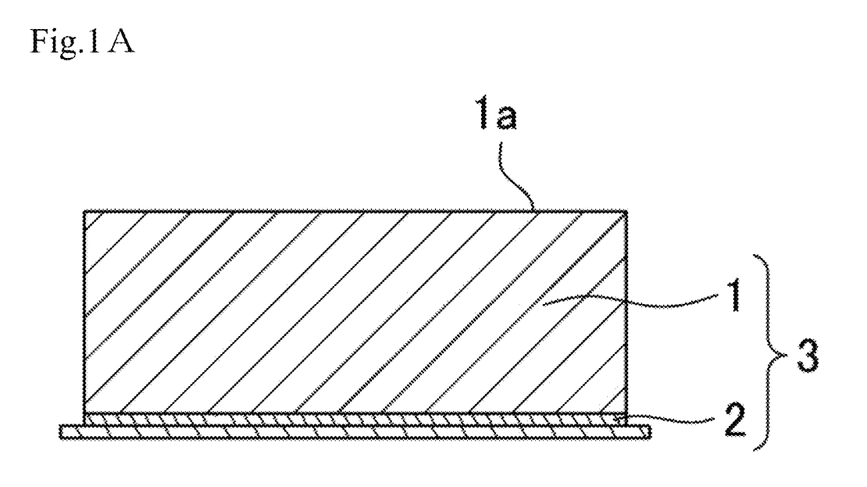
FIG. 1A is a schematic cross-sectional view of the main part of a wafer for describing a method of manufacturing light emitting elements of the present disclosure.
Figure 1B:
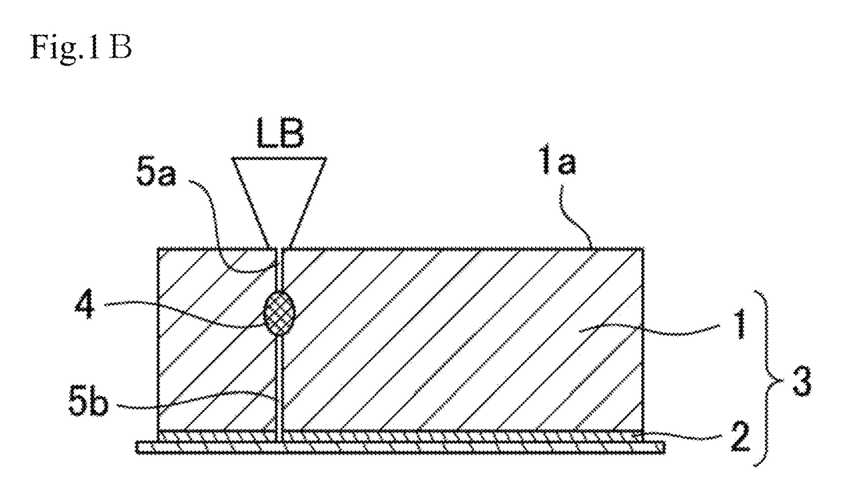
FIG. 1B is a schematic cross-sectional view of the main part of the wafer for describing the method of manufacturing light emitting elements of the present disclosure.
Figure 1C:
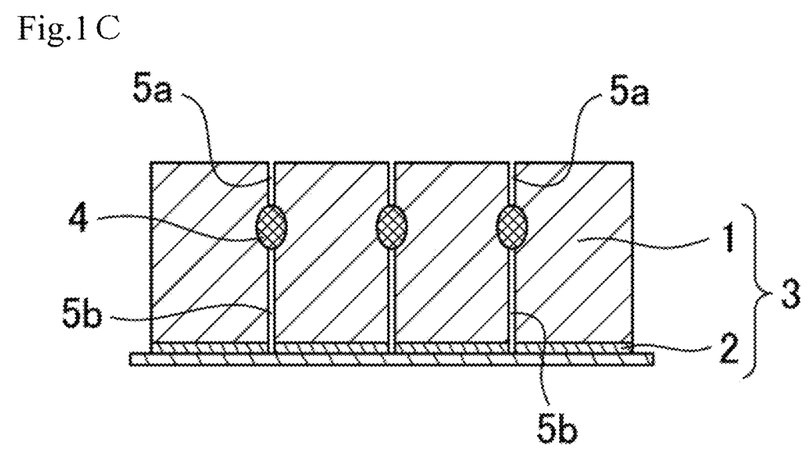
FIG. 1C is a schematic cross-sectional view of the main part of the wafer for describing the method of manufacturing light emitting elements of the present disclosure.
Figure 1D:
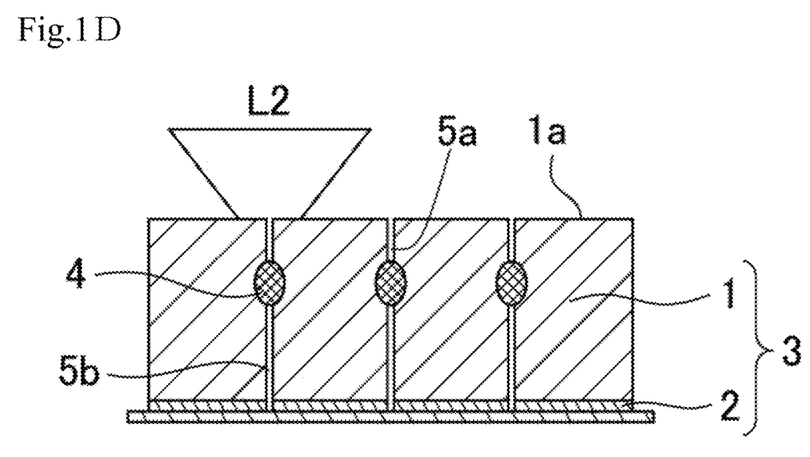
FIG. 1D is a schematic cross-sectional view of the main part of the wafer for describing the method of manufacturing light emitting elements of the present disclosure.
Figure 1E:
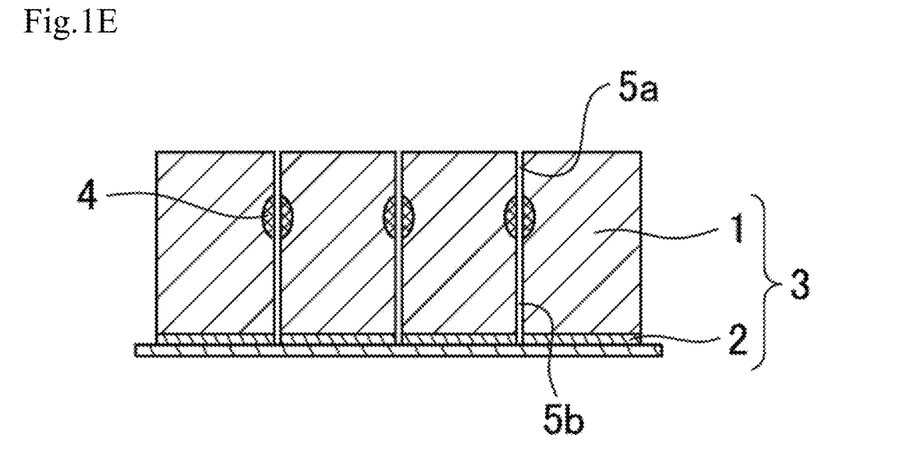
FIG. 1E is a schematic cross-sectional view of the main part of the wafer for describing the method of manufacturing light emitting elements of the present disclosure.
Figure 1F:
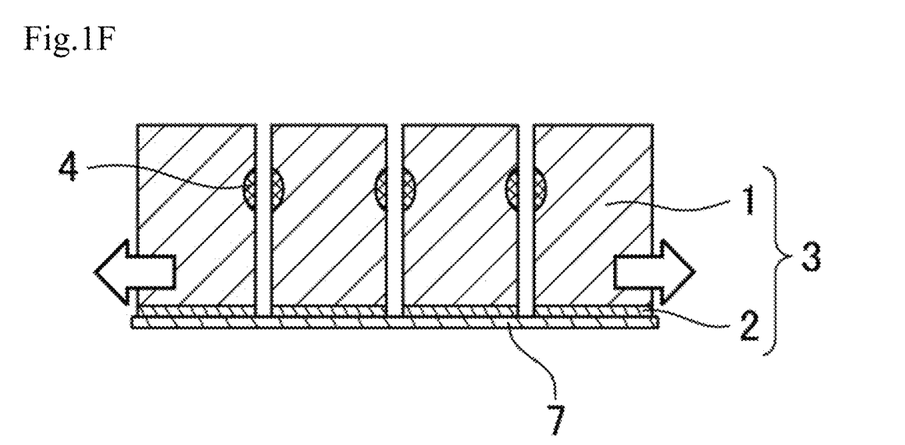
FIG. 1F is a schematic cross-sectional view of the main part of the wafer for describing the method of manufacturing light emitting elements of the present disclosure.

As shown in FIGS. 1A to 1F, a method of manufacturing light emitting elements according to one embodiment includes: providing a wafer including a substrate made of sapphire and having a first main surface and a second main surface, and a semiconductor layered body disposed on the first main surface of the substrate (FIG. 1A); irradiating a laser beam into the substrate to form a modified region inside the substrate, the modified region having a crack reaching the first main surface and a crack reaching the second main surface (FIGS. 1B, 1C); irradiating $CO_2$ laser overlapping with a region where the laser beam has been irradiated (FIGS. 1D, 1E); and cleaving the wafer along the modified region to obtain light emitting elements having a hexagonal shape in a plan view (FIG. 1F).

Providing Wafer

As shown in FIG. 1A, a sapphire substrate 1 having a first main surface and a second main surface 1a is provided. While the sapphire substrate exhibits very poor cleavage property due to its crystal structure, using the method according to the present disclosure allows for improving cutting in the direction where the cleavage is poor. Therefore, the effect according to the present disclosure can be greatly exhibited when using a sapphire substrate. The substrate has a thickness in a range of, for example, 50 μm to 2 mm, preferably 50 μm to 1 mm, and further preferably 50 μm to 500 μm. The sapphire substrate may have a plurality of projections or irregular shapes. The sapphire may have an offset angle of about 0° to 10° relative to a predetermined crystal plane such as C-plane or A-plane.

Figure 7:
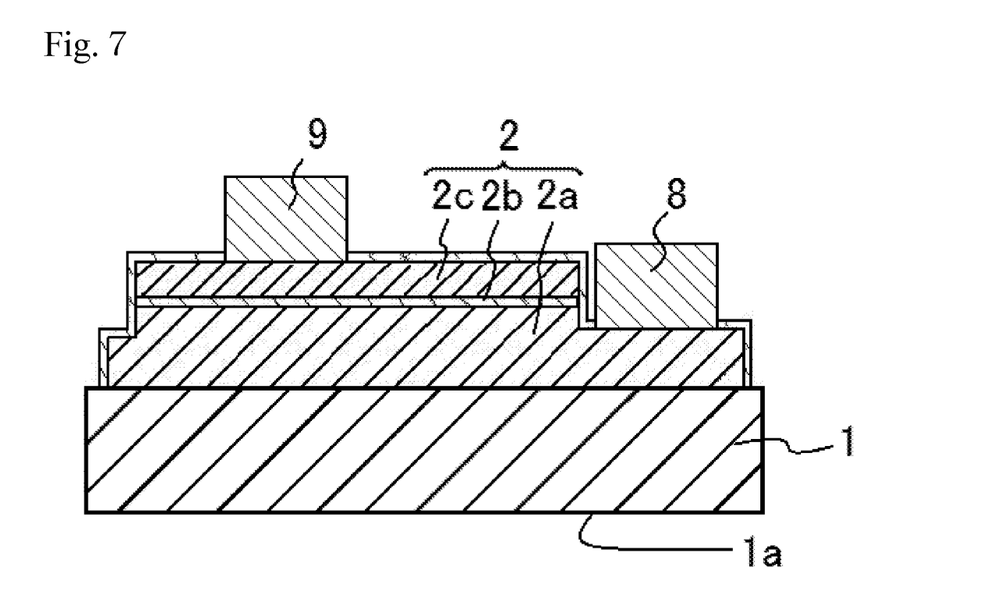
FIG. 7 is a cross-sectional view for describing the cross section of a light emitting element obtained through the method of manufacturing light emitting elements of the present disclosure.

For example, as shown in FIG. 7, a semiconductor layered body 2 in which a first semiconductor layer (for example, an n-type semiconductor layer) 2a, a light emitting layer 2b, a second semiconductor layer (for example, a p-type semiconductor layer) 2c layered are layered in this order is disposed on the first main surface of the substrate 1. One of the first semiconductor layer 2a and the second semiconductor layer 2c can be n-type, and the other of the first semiconductor layer 2a and the second semiconductor layer 2c can be p-type. A buffer layer or the like may be disposed between the substrate and the first semiconductor layer. FIG. 7 shows a single semiconductor layered body that forms a single light emitting element. Accordingly, the scale of FIG. 7 is different from that of FIG. 1A, etc.

The first semiconductor layer, the light emitting layer, and the second semiconductor layer may be of any appropriate type, and may be made of any appropriate materials. For example, various semiconductors, such as Group III-V compound semiconductor and Group II-VI compound semiconductor, may be employed for the first semiconductor layer. More specifically, a nitride-based semiconductor material such as $In_XAl_YGa_{1-X-Y}N$ ($0 \leq X$, $0 \leq Y$, $X+Y \leq 1$) and may be InN, AlN, GaN, InGaN, AlGaN, or InGaAlN may be used for the first semiconductor layer. Each layer can have any appropriate thickness and structure known in the art.

Subsequently, for example as shown in FIG. 7, a first electrode 8 and a second electrode 9 which respectively connect to the first semiconductor layer 2a and the second semiconductor layer 2c are preferably disposed on the wafer 3 that includes the semiconductor layered body 2 on the first main surface of the sapphire substrate 1. These electrodes may be disposed in any appropriate step described below.

For example, in order to form the first electrode 8 at the first semiconductor layer 2a, the second semiconductor layer 2c and the light emitting layer 2b are partially removed to expose the first semiconductor layer 2a. At this time, as will be described below, a groove in which the first semiconductor layer is exposed is preferably formed also at a portion on which a planned cleavage line is to be formed (that is, the position where the laser beam is to be irradiated) for cleaving the wafer into individual light emitting elements. With formation of such a groove, damage of the active layer and the second semiconductor layer caused by irradiation with the laser beam can be reduced.

The second semiconductor layer and the light emitting layer may be removed by, for example, dry etching such as reactive ion etching, ion milling, focused ion beam etching, and ECR etching, or wet etching using mixed acid including sulfuric acid, phosphoric acid or the like.

The first electrode 8 and the second electrode 9 may be formed of, for example, a single-layer film or a multilayer film of metal such as Au, Pt, Pd, Rh, Ni, W, Mo, Cr, Ti, or alloy of these. More specifically, the first electrode 8 and the second electrode 9 are preferably formed of a multilayer film of, for example, Ti/Rh/Au, W/Pt/Au, Rh/Pt/Au, W/Pt/Au, Ni/Pt/Au, or Ti/Rh, layered in this order from the first semiconductor layer 2a side or the second semiconductor layer 2c side. The first electrode 8 and the second electrode 9 may have any appropriate thickness employed in the art. The first electrode and the second electrode preferably include, respectively on the first semiconductor layer side and on the second semiconductor layer side, a material layer having relatively high reflectance to light emitted from the light emitting layer. Examples of the material layer with high reflectivity include a layer including silver, silver alloy, or aluminum.

A DBR (distributed Bragg reflector) layer or the like may be disposed at a degree not disturbing the electrical connection between them Between the first electrode 8 and the first semiconductor layer 2a and between the second electrode 9 and the second semiconductor layer 2c. The DBR may contain, for example, oxide or nitride of at least one selected from the group consisting of Si, Ti, Zr, Nb, Ta, and Al.

Forming Modified Region 4

As shown in FIGS. 1B and 1C, a laser beam LB is applied to the inside of the sapphire substrate 1 to form a modified region 4.

The modified region 4 may be formed by setting the focus position of the irradiating laser beam LB into the sapphire substrate 1, for example, at a position at a predetermined depth from the first main surface of the sapphire substrate 1, and irradiating the laser beam having a predetermined energy. Thus, the energy of the irradiated laser beam causes the multiphoton absorption, in which an electron absorbs a plurality of photons. The excited electron transfers the energy to a lattice so that thermal energy is generated. That is, due to the lattice vibration, a region near the light-concentrated portion is influenced by heat, resulting in the generation of a high-temperature portion. The high temperature portion is strongly compressed by melting, vaporization, or sublimation, and has a high dislocation density. It is considered that, when such a region of a high dislocation density is deformed by stress, a modified region having a crack is formed. The crack extending from the modified region extends in the depth direction of the wafer and in the direction parallel to the wafer. Forming the modified region in the laser scanning direction causes cracks in the modified region to extend to be connected to each other. In the case where a plurality of modified regions are formed in the depth direction of the wafer, the modified regions are formed such that a crack in the lower modified region is connected to a crack in the upper modified region. It is considered that a crack is not present inside the formed modified region 4. Each of the cracks extends toward a respective one of the first main surface and the second main surface 1a of the substrate 1. Accordingly, the modified region 4 having a crack 5b that reaches the first main surface and a crack 5a that reaches the second main surface 1a is formed.

While a single modified region preferably has both the crack that reaches the first main surface and the crack that reaches the second main surface, it is sufficient that at least one modified region of a plurality of modified regions has the crack that reaches the first main surface and the that reaches the second main surface. That is, a portion of the plurality of modified regions may have one of the cracks that reaches the first main surface and the crack that reaches the second main surface. It is preferable that, as shown in FIG. 1C, each of all the plurality of modified regions has the crack that reaches the first main surface and the crack that reaches the second main surface. The crack that reaches the second main surface may extend to the semiconductor layered body.

The modified region 4 preferably has a crack that connects adjacent modified regions in a plan view in the sapphire substrate 1. That is, a crack that connects at least two adjacent modified regions of a plurality adjacent modified regions is generated. With the crack that connects adjacent modified regions, when cleaving the wafer to be separated into a plurality of light emitting elements, disadvantages that the light emitting elements are connected to each other and are failed to be separated into individual light emitting elements can be prevented.

The cracks can be controlled by controlling one of, preferably all of, a type, an output, a frequency, a scanning speed, a spot diameter, and an irradiated position in the substrate (for example, the depth from the main surface of the substrate, and the interval) of the laser beam.

While the irradiation of with laser beam may be performed either on the first main surface side or the second main surface side of the sapphire substrate, preferably the laser beam is irradiated from the second main surface side, where the semiconductor layered body is not formed. This allows for reducing the damage to the semiconductor layered body that may be caused by the laser beam.

Examples of a laser having a wavelength that can be transmitted through the sapphire substrate include Nd:YAG laser, Nd:YVO4 laser, Nd:YLF laser, KrF excimer laser, titanium sapphire laser, KGW laser, and the like. The laser beam preferably has a wavelength that can be transmitted through the sapphire substrate, for example, a wavelength in a range of 200 nm to 1400 nm, preferably 1000 nm to 1100 nm. For the laser beam, a pulsed laser beam such as femtosecond laser, or picosecond laser is preferably used. The pulse width of the pulsed laser beam is appropriately selected within a range that enables modification by the multiphoton absorption, so as to form a modified region without discoloration of the substrate that may cause light absorption. The pulse width of the laser beam may be in a range of, for example, 100 fsec to 1000 psec, preferably 300 fsec to 600 psec. The pulse width in this range allows for preventing discoloration caused by coagulation after the melting of the sapphire in the modified region. This is particularly advantageous for the light emitting elements obtained after the cleaving.

The output in the laser irradiation is preferably a minimum possible value required for forming a predetermined crack. Because an excessive laser output may thermally damage the substrate and/or the semiconductor layered body, the output is such a minimum value, that is, in a range of 50 mW to 1000 mW, preferably 100 mW to 600 mW, and further preferably 100 mW to 400 mW. This allows for causing generation of a crack which extends enough to function as a guide and which is less likely to meander and branch.

The frequency of the laser beam may be in a range of 50 kHz to 200 kHz, preferably 50 kHz to 100 kHz.

The laser spot diameter of the laser beam may be in a range of 0.3 μm to 10 μm. The laser spot preferably has a circular shape, an oval shape, or shapes similar to these shapes.

The position inside the substrate (for example, the depth from the main surface of the substrate) is, for example, at a depth half the thickness of the sapphire substrate or less. More specifically, the position may be between the second main surface of the sapphire substrate and a depth of 150 μm.

The scanning speed of the laser beam may be in a range of 5 mm/s to 4000 mm/s, preferably 5 mm/s to 1500 mm/s, further preferably 50 mm/s to 1000 mm/s.

The interval of laser irradiation may be, more specifically, in a range of 0.025 μm to 30 μm, preferably 0.1 μm to 15 μm, and further preferably 1 μm to 10 μm. This interval is preferably substantially constant over the entirety of the intervals of laser irradiation.

In the scanning line on which the laser beam is caused to scan, the laser beam is irradiated to a portion on which the planned cleavage line for cleaving the wafer into individual light emitting elements are to be formed. Accordingly, the modified region is formed on the planned cleavage lines. As used herein, the "planned cleavage lines" refers to lines each corresponding to a respective one of sides of the obtained light emitting element in a plan view. Hereinafter, as indicated by solid lines in FIG. 2, a first side 11 and a second side 12 may be referred to as "first planned cleavage lines"; a third side 13 and a fourth side 14 may be referred to as "second planned cleavage lines"; and a fifth side 15 and a sixth side 16 may be referred to as "third planned cleavage lines".

Figure 2:
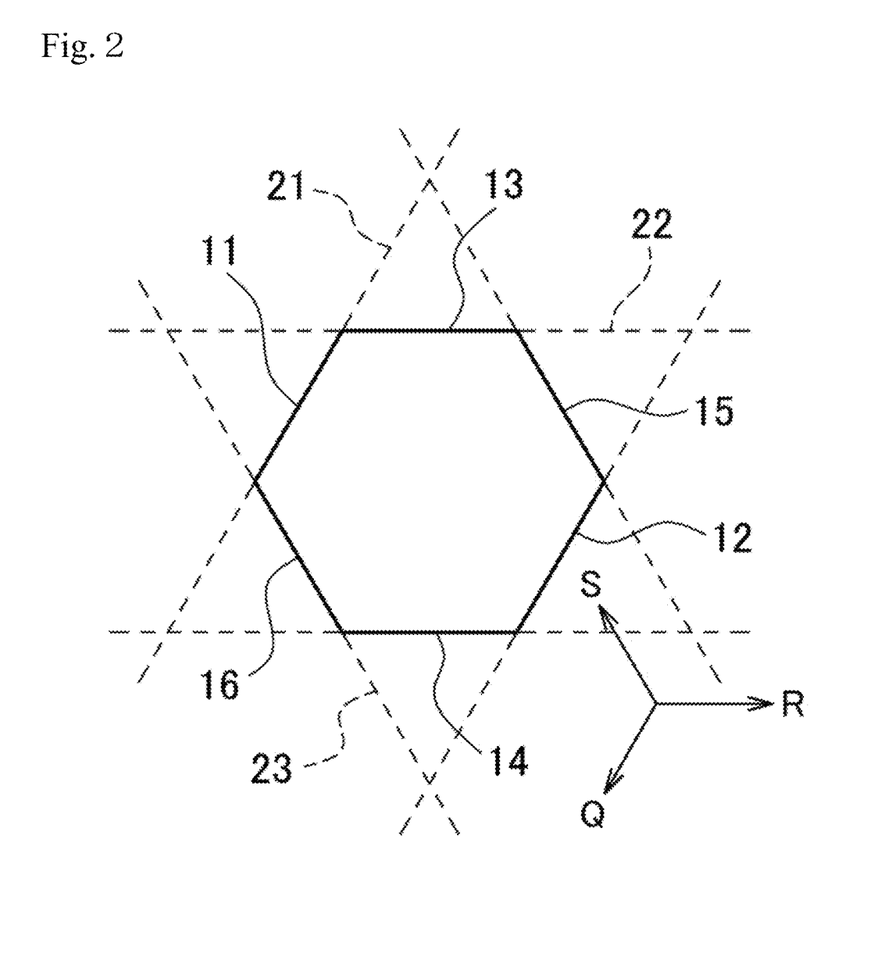
FIG. 2 is a schematic plan view of one light emitting element for describing laser beam application in a step of forming a modified region in the method of manufacturing light emitting elements of the present disclosure.

In the hexagonal shape in FIG. 2, two parallel lines extending in a first direction Q along the first side 11 and the second side 12, two parallel lines extending in a second direction R along the third side 13 and the fourth side 14, and two parallel lines extending in a third direction S along the fifth side 15 and the sixth side 16 represent the tracks of the scanned laser beam. Hereinafter, the lines extending in the first direction Q may be referred to as "first scanning lines 21"; the lines extending in the second direction R may be referred to as "second scanning lines 22"; and the lines extending in the third direction S may be referred to as "third scanning lines 23".

In other words, the forming of the modified region includes: scanning a laser beam in the first direction Q extending along the first side 11 and the second side 12 being parallel to each other in the hexagonal shape to irradiate the laser beam to the first side 11 and the second side 12; scanning a laser beam in the second direction R extending along the third side 13 and the fourth side 14 being parallel to each other in the hexagonal shape to irradiate the laser beam to the third side 13 and the fourth side 14; and scanning a laser beam along the third direction S extending along the fifth side 15 and the sixth side 16 being parallel each other in the hexagonal shape to irradiate the laser beam to the fifth side 15 and the sixth side 16. These scannings of the laser beam may be performed in any appropriate order.

Figure 6:
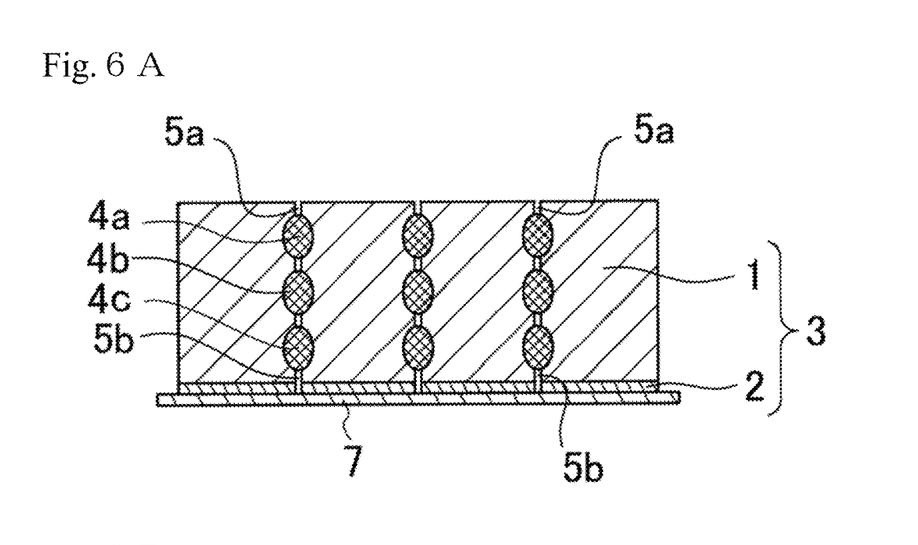
FIG. 6A is a schematic cross-sectional view of the main part of a wafer for describing a variation of the method of manufacturing light emitting elements of the present disclosure in FIG. 1C.
FIG. 6B is a schematic cross-sectional view of the main part of a wafer for describing a variation of the method of manufacturing light emitting elements of the present disclosure in FIG. 1D.
FIG. 6C is a schematic cross-sectional view of the main part of a wafer for describing a variation of the method of manufacturing light emitting elements of the present disclosure in FIG. 1E.

The laser beam irradiation may be performed once. Alternatively, the laser beam irradiation may be performed for a plurality of times, for example, twice or three time. In the case where the laser beam is irradiated for a plurality of times, for example, in the example shown in FIG. 6A, the laser beam is irradiated for three times on an identical planned cleavage line. In the case where the laser beam is irradiated for a plurality of times on a single planned cleavage line, the depth of the beam may be identical over the plurality of times, or may be partially or entirely different. That is, the modified regions may be partially or entirely overlapped in the depth direction of the wafer. Alternatively, as shown in FIG. 6A, all the modified regions may be spaced apart from each other.

In addition to the depth, the plurality of times of laser application may be performed under other conditions partially or entirely identical to or different from one another.

In the case where the laser beam is irradiation for a plurality of times on a single planned cleavage line, the laser beam is preferably irradiated to the single planned cleavage line for the plurality of times successively. For example, the laser beam may be irradiated successively for three times in the first direction Q; thereafter irradiated successively for three times in the second direction R; and thereafter irradiated successively for three times in the third direction S.

In general, a plurality of light emitting elements are formed from a single wafer. Therefore, in the case where light emitting elements have a hexagonal shape in a plan view, it is preferable to employ the layout in which the plurality of light emitting elements are arranged to be closely fitted together. Accordingly, the light emitting elements on a wafer may be arranged in, for example, the layout in FIG. 3 in which right hexagons are arranged to be closely fitted together. Thus, with the arrangement of the plurality of light emitting elements closely fitted together over the entire wafer, the yield in manufacturing the light emitting elements can be improved.

Figure 3:
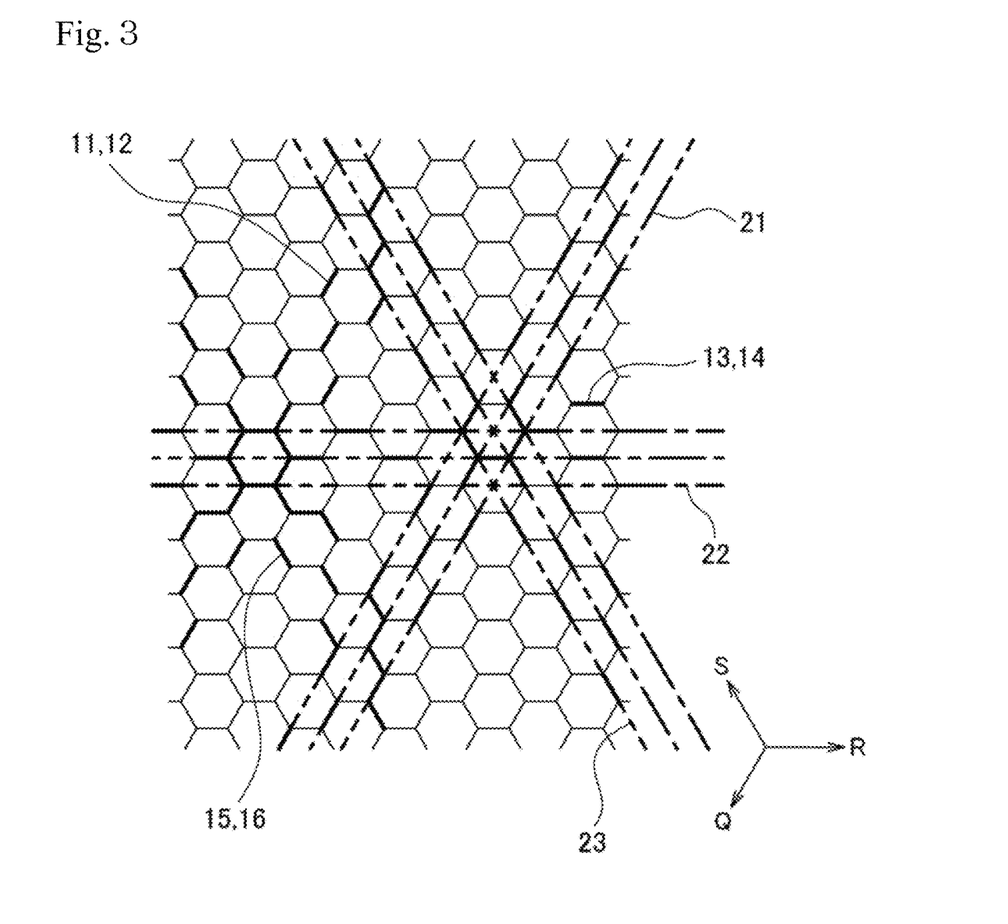
FIG. 3 is a schematic plan view of the wafer for describing laser beam application in the step of forming a modified region in the method of manufacturing light emitting elements of the present disclosure.

In order to form a plurality of light emitting elements having a regular-hexagonal shape in a plan view as shown in FIG. 3, it is preferable to perform laser beam irradiation along the parallel first scanning lines 21, the parallel second scanning lines 22 and the parallel third scanning lines 23 across a plurality of light emitting elements. The laser beam irradiation is preferably performed successively through all the parallel first scanning lines 21, successively through all the parallel second scanning lines 22, and successively through all the parallel third scanning lines 23. In this case, the distance between the first scanning lines 21, the distance between the second scanning lines 22, and the distance between the third scanning lines 23 are set as appropriate according to the size of the light emitting element to be obtained. The first scanning lines 21, the second scanning lines 22, and the third scanning lines 23 include portions overlapping sides of the light emitting elements and portions not overlapping the sides of the light emitting elements. Therefore, it is appropriate that the laser irradiation is performed intermittently along the first scanning lines 21, the second scanning lines 22 and the third scanning lines 23, in which the laser is irradiated only when scanning on sides of corresponding light emitting elements. In this manner, the laser beam can be irradiated quickly, easily and simply. The irradiation with the laser beam along the first scanning lines 21, the second scanning lines 22 and the third scanning lines 23 may be performed in any appropriate order.

Figure 4:
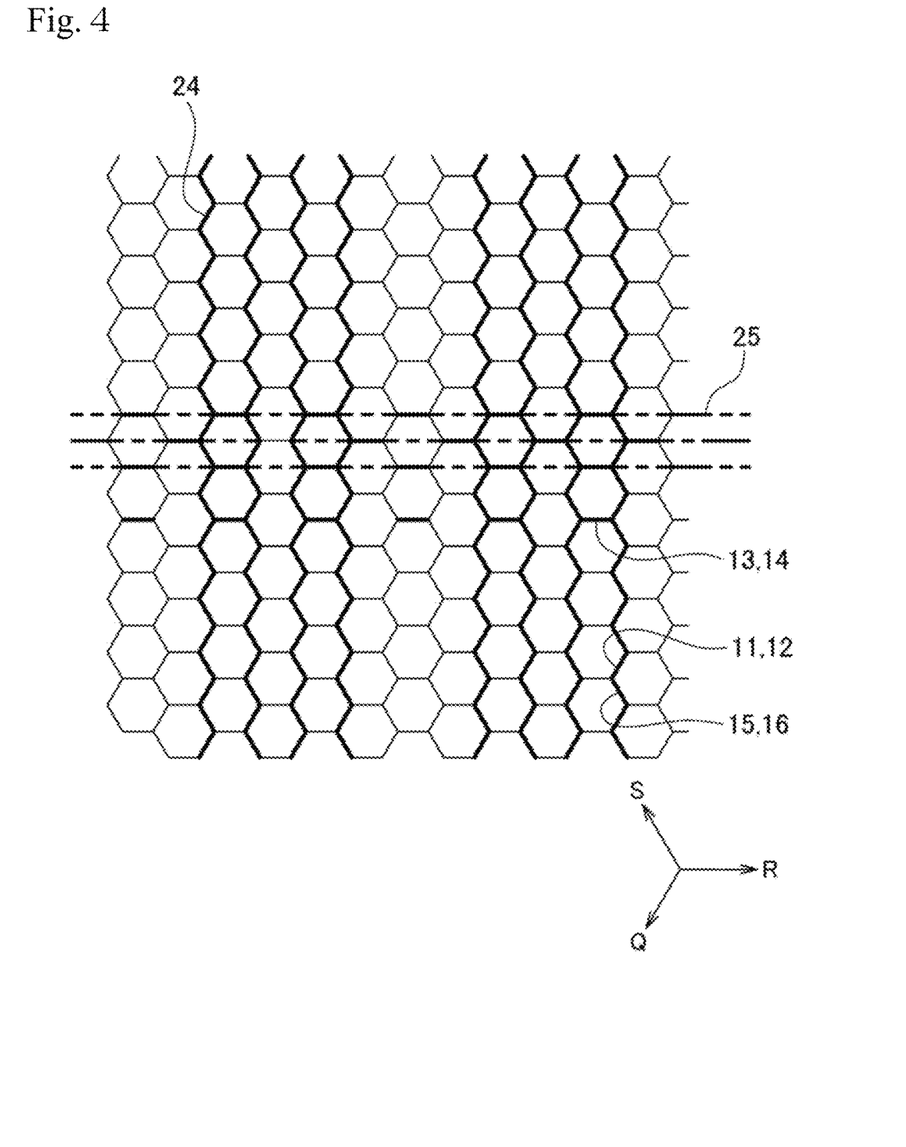
FIG. 4 is a schematic plan view of a wafer in a variation of the laser beam application in FIG. 3.

As shown in FIG. 4, the laser beam may be scanned while continuously irradiating a laser beam on a fourth scanning line 24 which is bent in a zigzag-manner along the sides of light emitting elements. Similarly to the laser beam application on the first scanning line 21, etc., in the laser beam irradiation on fifth scanning lines 25 in the second direction R, the laser beam is irradiated only on the planned cleavage line.

$CO_2$ Laser Application

After the laser beam LB is applied and the modified region 4 is formed, the $CO_2$ laser beam L2 is irradiated to the sapphire substrate in the region to which the laser beam LB has been irradiated as shown in FIG. 1D. The $CO_2$ laser beam L2 is preferably irradiated to overlap the line along which the laser beam LB has been irradiated.

While the $CO_2$ laser irradiation may be performed either from the first main surface side or from the second main surface side of the sapphire substrate, preferably the $CO_2$ laser is irradiated from the second main surface side where the semiconductor layered body is not disposed. This allows for reducing the damage to the semiconductor layered body that may be caused by the laser beam.

The $CO_2$ laser is one type of gas laser using carbon dioxide gas as a medium. With the $CO_2$ laser, a continuous wave or a pulsed wave in the infrared region, for example, in a wavelength band of 10.6 μm, or a pulsed wave of high output, can be obtained. The output of the $CO_2$ laser may be in a range of, for example, 3 W to 30 W, preferably 10 W to 20 W. With the output of the $CO_2$ laser in this range, when bonding an elastic sheet to the wafer which will be described later, the elastic sheet can be prevented from being melt-adhered on the wafer.

The frequency of the $CO_2$ laser beam may be in a range of, for example, 5 kHz to 100 kHz, preferably 5 kHz to 50 kHz.

The scanning speed of the $CO_2$ laser beam may be in a range of 5 mm/s to 4000 mm/s, preferably 5 mm/s to 1500 mm/s, and further preferably 50 mm/s to 1000 mm/s.

The laser spot diameter of the $CO_2$ laser beam may be in a range of 50 μm to 1000 μm, preferably 50 μm to 700 μm, and further preferably 100 μm to 700 μm.

The focus of the $CO_2$ laser beam is preferably set to the position at a depth in a range of 0 mm 10 mm from the second main surface.

The interval of $CO_2$ laser irradiation may be in a range of 0.1 μm to 300 μm, preferably 5 μm to 1000 μm, and further preferably 5 μm to 50 μm. This interval is preferably substantially constant over the entirety of the intervals of irradiation with $CO_2$ laser. In particular, it is further preferable that the $CO_2$ laser is irradiated at the positions identical to the positions to which the laser beam LB has been irradiated.

The $CO_2$ laser beam may be irradiated once. Alternatively, the $CO_2$ laser beam may be irradiated for a plurality of times, for example, twice.

As described above, after the laser beam LB is irradiated to an inner portion of the sapphire substrate 1, the $CO_2$ laser beam L2 is further irradiated to the sapphire substrate 1. With this irradiation, as shown in FIG. 1E, strength against breaking that has been maintained by the modified region 4 in the sapphire substrate 1 can be reduced due to the thermal expansion, which allows the wafer to be cleaved in the thickness direction and the cleaving direction of the sapphire substrate 1 in a desired region.

Cleaving

The wafer 3 is cleaved along the modified region 4. That is, the wafer is cleaved at the planned cleavage line along the portion formed by the laser beam LB and the $CO_2$ laser beam. Thus, the wafer can be appropriately cleaved with the first planned cleavage line, the second planned cleavage line, the third planned cleavage line and the like. Accordingly, light emitting elements having a hexagonal shape in a plan view can be manufactured in high yield, without deviation from the planned cleavage line in the cleaving.

Figure 1G:
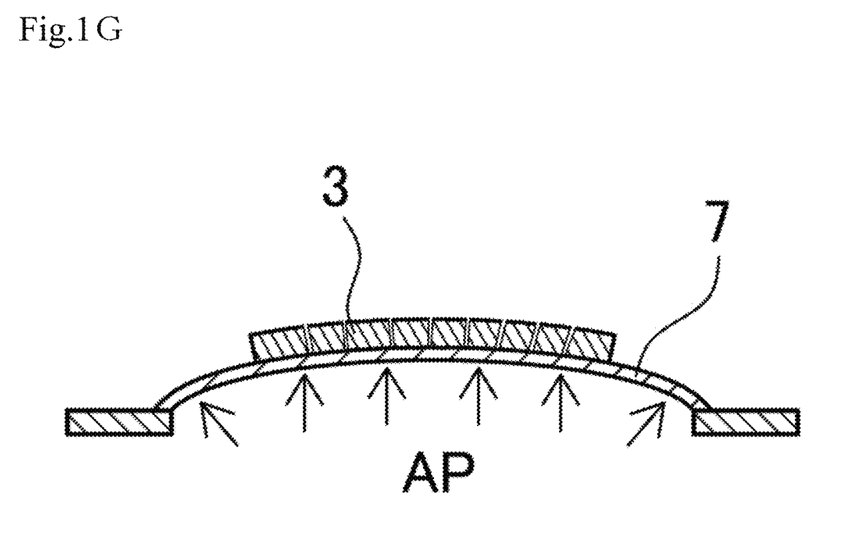
FIG. 1G is a schematic cross-sectional view of the main part of the wafer for describing a variation of the method of manufacturing light emitting elements of the present disclosure.

As shown in FIGS. 1F and 1G, the wafer is preferably cleaved using an elastic sheet 7. For example, the wafer 3 can be cleaved by bonding the wafer 3 to the elastic sheet 7 and stretching the elastic sheet 7. The elastic sheet 7 may be stretched using any appropriate method known in the field of semiconductor manufacturing process. For example, as shown in FIG. 1F, the elastic sheet 7 may be stretched by pulling the ends of the elastic sheet 7 in the opposite directions.

Alternatively, as shown in FIG. 1G, air pressure AP may be applied from below a lower surface of the elastic sheet 7 to stretch the elastic sheet 7 so that the wafer becomes spherical. Applying air pressure AP causes the elastic sheet 7 to be stretched so that the wafer becomes spherical, which allows for evenly stretching the elastic sheet and applying stress in the direction in which the wafer is bent. Accordingly, the wafer is surely cleaved into light emitting elements. The flow rate of air in applying the air pressure AP may be in a range of 1 L/min to 50 L/min, preferably 20 L/min to 30 L/min.

Alternatively, using a spherical die configured to separate by increasing the distance between adjacent chips, the wafer may be put along the spherical die to cleave the wafer.

Further alternatively, the wafer may be cleaved using a chip breaker employing a roller, a notch, and the like.

Manufacturing light emitting elements through a series of steps described above to separate light emitting elements to have a hexagonal shape in a top view, cleaving with deviation from the planned cleavage line can be surely reduced, so that the light emitting elements can be manufactured in high yield.

Grinding and/or Polishing Substrate

The second main surface side of the substrate may be ground and/or polished at any appropriate time such as after forming the semiconductor layered body, after forming the groove for exposing the first semiconductor layer, before or after the laser beam application, before or after the $CO_2$ laser application, or before cleaving the wafer. The smaller the thickness of the substrate resulting from the grinding and/or polishing, the smaller the breakage of the semiconductor layered body and the like when cleaving the wafer, so that hexagonal light emitting elements can be efficiently obtained. On the other hand, if a resultant thickness of the wafer is excessively small, the wafer may be greatly warped, which may lead to difficulty in cleaving of the wafer or may cause breakage of the wafer. Accordingly, the grinding and/or polishing the wafer is preferably performed so that the thickness of the wafer is in a range of 50 μm to 300 μm. The grinding and polishing the wafer may be performed by any appropriate method known in the art. In particular, the grinding and polishing using abrasive grains such as diamond is preferable.

Example 1

As shown in FIG. 1A, a wafer 3 was provided, in which a semiconductor layered body 2 formed of nitride semiconductors was disposed on a first main surface of a sapphire substrate 1 having a first main surface and a second main surface 1a. A four-inch wafer was used for the wafer 3. The wafer was set to have a thickness of 200 μm after polishing. Thereafter, a portion of the semiconductor layered body was removed by etching, and the first electrode connected to the first semiconductor layer and the second electrode connected to the second semiconductor layer were formed.

Subsequently, the obtained wafer was bonded onto the elastic sheet 7. As shown in FIG. 6A, the laser beam LB was irradiated to an inner portion of the sapphire substrate 1 to form the modified region 4, having a hexagonal shape in a top view, inside the sapphire substrate 1. The forming of the modified region 4 was carried out by irradiating a laser beam for three times from a second main surface side of the sapphire substrate. The irradiation with the laser beam for three times was performed with the focus position set at the depths of 50 μm, 33 μm, and 15 μm in the sapphire substrate from the second main surface. The irradiation with the laser beam for three times was performed at the output of 0.17 W, the scanning speed of 450 mm/s, the frequency of 50 kHz, the pulse width of 500 psec, and the wavelength of 532 nm. Accordingly, a modified region 4a located on the second main surface side and having the crack 5a that reaches the second main surface and a modified region 4c located on the first main surface side and having the crack 5b that reaches the first main surface were formed. The modified region 4b located between the modified region 4c on the second main surface side and the modified region 4a on the first main surface side was formed to have cracks that reach the modified region 4a and the modified region 4c. The crack that reaches the first main surface may extend through the semiconductor layered body.

Subsequently, as shown in FIG. 6B, the $CO_2$ laser beam L2 was irradiated once from the second main surface side of the sapphire substrate 1 to the sapphire substrate 1 in an overlapping manner with the region where the laser beam LB had been irradiated, that is, so as to overlap with the modified region 4. The $CO_2$ laser beam was irradiated under the conditions of: the focus set at a depth of 5 mm from the second main surface of the sapphire substrate 1; the output of 15.2 W; the scanning speed of 625 mm/s; and the frequency of 25 kHz.

As shown in FIG. 6C, with the irradiation with the $CO_2$ laser beam L2, the strength of the sapphire substrate 1 against breaking, which had been maintained by the modified region 4 in the sapphire substrate 1, was reduced due to the thermal expansion attributed to the irradiation the $CO_2$ laser beam L2.

Thereafter, as shown in FIG. 1G, an air was supplied at the flow rate of 25 L/min from a back side of the elastic sheet 7 so that the elastic sheet 7 swelled to reach the height of 11 mm, the state where the elastic sheet 7 was stretched to become spherical was maintained for one minute, so that the wafer 3 was cleaved along the modified region 4. Accordingly, light emitting elements having a regular-hexagonal shape in a plan view were manufactured.

Figure 5:
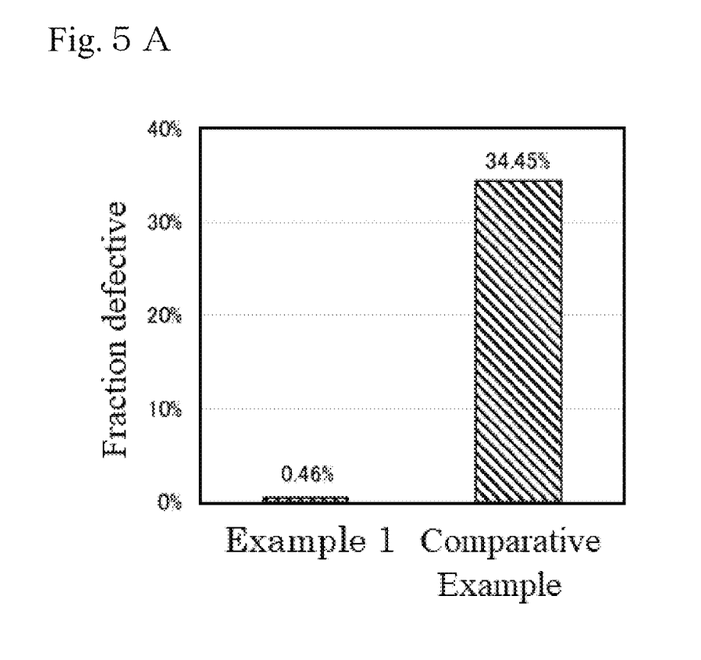
FIG. 5A is a graph for describing the yield when using the method of manufacturing light emitting elements of the present disclosure.
FIG. 5B is an enlarged photograph of a plan view of a wafer for describing the state where the wafer fails to be cleaved straight in a planned cleavage line in the method of manufacturing light emitting elements of the present disclosure.

The yield of the light emitting elements obtained through a series of steps was evaluated. As a result, with reference to FIG. 5A, the fraction defective due to failure in cleaving the wafer straightly in the planned cleavage line as shown in FIG. 5B was 0.46% to the total light emitting elements manufactured from a single wafer.

On the other hand, in Comparative Example, irradiation with laser was performed without irradiating with the $CO_2$ laser beam L2, and then the elastic sheet was stretched by applying the load of the air pressure, so that the wafer was cleaved along the modified region 4. Thus, light emitting elements having a right hexagonal shape in a plan view were manufactured. In this case, the fraction defective due to failure in cleaving the wafer straightly in the planned cleavage line was 34.45% to the total light emitting elements manufactured from a piece of wafer.

It is to be understood that although certain embodiments of the present invention have been described, various other embodiments and variants may occur to those skilled in the art that are within the scope and spirit of the invention, and such other embodiments and variants are intended to be covered by the following claims

What is claimed is:

1. A method of manufacturing light emitting elements, the method comprising:
   providing a wafer, the wafer including
      a substrate formed of sapphire and having a first main surface and a second main surface, and
      a semiconductor layered body disposed on the first main surface of the substrate;
   irradiating a laser beam into the substrate to form a modified region inside the substrate, the modified region having a crack reaching the first main surface and a crack reaching the second main surface;
   irradiating $CO_2$ laser to a region of the substrate overlapping with a region to which the laser beam has been irradiated; and
   cleaving the wafer along the modified region to obtain the light emitting elements each having a hexagonal shape in a plan view, wherein
   the cleaving of the wafer includes bonding the wafer to an elastic sheet and applying air pressure from a side of the elastic sheet opposite to the wafer, and
   the irradiating of the $CO_2$ laser includes irradiating the $CO_2$ laser with an output of the $CO_2$ laser being 3 W or higher and being lower than 30 W.

2. The method of manufacturing light emitting elements according to claim 1, wherein
   the irradiating of the laser beam includes irradiating the laser beam from a second main surface side of the substrate.

3. The method of manufacturing light emitting elements according to claim 2, wherein
   the irradiating of the laser beam includes:
      scanning the laser beam along a first direction parallel to a first side and a second side of the hexagonal shape, which are parallel to each other, to irradiate the laser beam to regions corresponding to the first side and the second side;
      scanning the laser beam in a second direction parallel to a third side and a fourth side of the hexagonal shape, which are parallel to each other, to irradiate the laser beam to regions corresponding to the third side and the fourth side; and
      scanning the laser beam in a third direction parallel to a fifth side and a sixth side of the hexagonal shape, which are parallel to each other, to irradiate the laser beam to regions corresponding to the fifth side and the sixth side.

4. The method of manufacturing light emitting elements according to claim 1, wherein
   the irradiating of the laser beam includes irradiating the laser beam from a second main surface side of the substrate.

5. The method of manufacturing light emitting elements according to claim 4, wherein
   the irradiating of the laser beam includes:
      scanning the laser beam along a first direction parallel to a first side and a second side of the hexagonal shape, which are parallel to each other, to irradiate the laser beam to regions corresponding to the first side and the second side;
      scanning the laser beam in a second direction parallel to a third side and a fourth side of the hexagonal shape, which are parallel to each other, to irradiate the laser beam to regions corresponding to the third side and the fourth side; and
      scanning the laser beam in a third direction parallel to a fifth side and a sixth side of the hexagonal shape, which are parallel to each other, to irradiate the laser beam to regions corresponding to the fifth side and the sixth side.

6. The method of manufacturing light emitting elements according to claim 1, wherein
   the irradiating of the laser beam includes:
      scanning the laser beam along a first direction parallel to a first side and a second side of the hexagonal shape, which are parallel to each other, to irradiate the laser beam to regions corresponding to the first side and the second side;
      scanning the laser beam in a second direction parallel to a third side and a fourth side of the hexagonal shape, which are parallel to each other, to irradiate the laser beam to regions corresponding to the third side and the fourth side; and
      scanning the laser beam in a third direction parallel to a fifth side and a sixth side of the hexagonal shape, which are parallel to each other, to irradiate the laser beam to regions corresponding to the fifth side and the sixth side.

7. The method of manufacturing light emitting elements according to claim 1, wherein
   the irradiating of the laser beam includes:
      scanning the laser beam along a first direction parallel to a first side and a second side of the hexagonal shape, which are parallel to each other, to irradiate the laser beam to regions corresponding to the first side and the second side;
      scanning the laser beam in a second direction parallel to a third side and a fourth side of the hexagonal shape, which are parallel to each other, to irradiate the laser beam to regions corresponding to the third side and the fourth side; and
      scanning the laser beam in a third direction parallel to a fifth side and a sixth side of the hexagonal shape, which are parallel to each other, to irradiate the laser beam to regions corresponding to the fifth side and the sixth side.

8. The method of manufacturing light emitting elements according to claim 1, wherein
   the cleaving of the wafer includes stretching the elastic sheet by the applying of the air pressure.

9. The method of manufacturing light emitting elements according to claim 1, wherein
   the irradiating of the $CO_2$ laser includes irradiating the $CO_2$ laser from a second main surface side of the substrate.

10. The method of manufacturing light emitting elements according to claim 1, wherein
    the irradiating of the $CO_2$ laser includes irradiating the $CO_2$ laser with the output of the $CO_2$ laser in a range of 10 W to 20 W.

11. The method of manufacturing light emitting elements according to claim 1, wherein the irradiating of the $CO_2$ laser includes irradiating the $CO_2$ laser with a laser spot diameter of the $CO_2$ laser in a range of 100 µm to 700 µm.

12. The method of manufacturing light emitting elements according to claim 1, wherein
the irradiating of the $CO_2$ laser includes irradiating the $CO_2$ laser with an interval of the $CO_2$ laser in a range of 5 µm to 50 µm.

13. A method of manufacturing light emitting elements comprising:
providing a wafer, the wafer including
a substrate formed of sapphire and having a first main surface and a second main surface, and
a semiconductor layered body disposed on the first main surface of the substrate;
irradiating a laser beam into the substrate to form a modified region inside the substrate, the modified region having a crack reaching the first main surface and a crack reaching the second main surface;
irradiating $CO_2$ laser to a region of the substrate overlapping with a region to which the laser beam has been irradiated; and
cleaving the wafer along the modified region to obtain the light emitting elements each having a hexagonal shape in a plan view, wherein
the cleaving of the wafer includes bonding the wafer to an elastic sheet and applying air pressure from a side of the elastic sheet opposite to the wafer, wherein
the irradiating of the laser beam includes
scanning the laser beam in a zig-zag manner along sides of the hexagonal shape to irradiate the laser beam to regions corresponding to the sides of the hexagonal shape.

14. The method of manufacturing light emitting elements according to claim 13, wherein
the irradiating of the laser beam further includes
scanning the laser beam along a direction parallel to a pair of opposing sides of the hexagonal shape, which are parallel to each other, to irradiate the laser beam to regions corresponding to the opposing sides.

15. A method of manufacturing light emitting elements, the method comprising:
providing a wafer, the wafer including
a substrate formed of sapphire and having a first main surface and a second main surface, and
a semiconductor layered body disposed on the first main surface of the substrate;
bonding the wafer to an elastic sheet
irradiating a laser beam into the substrate to form a modified region inside the substrate, the modified region having a crack reaching the first main surface and a crack reaching the second main surface;
in a state in which the wafer is bonded to the elastic sheet, irradiating $CO_2$ laser to a region of the substrate overlapping with a region to which the laser beam has been irradiated; and
cleaving the wafer along the modified region to obtain the light emitting elements, wherein
the irradiating of the $CO_2$ laser includes irradiating the $CO_2$ laser with an output of the $CO_2$ laser being 3 W or higher and being lower than 30 W.

16. The method of manufacturing light emitting elements according to claim 15, wherein the irradiating of the laser beam includes irradiating the laser beam from a second main surface side of the substrate.

17. The method of manufacturing light emitting elements according to claim 16, wherein
the irradiating of the laser beam includes:
scanning the laser beam along a first direction parallel to a first side and a second side of the hexagonal shape, which are parallel to each other, to irradiate the laser beam to regions corresponding to the first side and the second side;
scanning the laser beam in a second direction parallel to a third side and a fourth side of the hexagonal shape, which are parallel to each other, to irradiate the laser beam to regions corresponding to the third side and the fourth side; and
scanning the laser beam in a third direction parallel to a fifth side and a sixth side of the hexagonal shape, which are parallel to each other, to irradiate the laser beam to regions corresponding to the fifth side and the sixth side.

18. The method of manufacturing light emitting elements according to claim 15, wherein
the irradiating of the laser beam includes:
scanning the laser beam along a first direction parallel to a first side and a second side of the hexagonal shape, which are parallel to each other, to irradiate the laser beam to regions corresponding to the first side and the second side;
scanning the laser beam in a second direction parallel to a third side and a fourth side of the hexagonal shape, which are parallel to each other, to irradiate the laser beam to regions corresponding to the third side and the fourth side; and
scanning the laser beam in a third direction parallel to a fifth side and a sixth side of the hexagonal shape, which are parallel to each other, to irradiate the laser beam to regions corresponding to the fifth side and the sixth side.

19. The method of manufacturing light emitting elements according to claim 15, wherein
the cleaving of the wafer includes cleaving the wafer to obtain the light emitting elements each having a hexagonal shape in a plan view.

20. The method of manufacturing light emitting elements according to claim 15, wherein
the irradiating of the $CO_2$ laser includes irradiating the $CO_2$ laser with the output of the $CO_2$ laser in a range of 10 W to 20 W.

21. The method of manufacturing light emitting elements according to claim 15, further comprising
the cleaving of the wafer includes applying air pressure from a side of the elastic sheet opposite to the wafer.

22. The method of manufacturing light emitting elements according to claim 15, wherein
the irradiating of the $CO_2$ laser includes irradiating the $CO_2$ laser with a laser spot diameter of the $CO_2$ laser in a range of 100 µm to 700 µm.

23. The method of manufacturing light emitting elements according to claim 15, wherein
the irradiating of the $CO_2$ laser includes irradiating the $CO_2$ laser with an interval of the $CO_2$ laser in a range of 5 µm to 50 µm.

* * * * *